United States Patent
Suzuki et al.

(10) Patent No.: US 6,838,934 B2
(45) Date of Patent: Jan. 4, 2005

(54) FEEDFORWARD AMPLIFIER WITH DUAL LOOP

(75) Inventors: Yasunori Suzuki, Yokohama (JP); Toshio Nojima, Sapporo (JP)

(73) Assignee: NTT DoCoMo, Inc., Tokyo (JP)

( * ) Notice: Subject to any disclaimer, the term of this patent is extended or adjusted under 35 U.S.C. 154(b) by 124 days.

(21) Appl. No.: 10/287,681

(22) Filed: Nov. 5, 2002

(65) Prior Publication Data

US 2003/0085759 A1 May 8, 2003

(30) Foreign Application Priority Data

Nov. 6, 2001 (JP) .................................... 2001-340534

(51) Int. Cl.⁷ .............................. H03F 3/66; H03F 1/26
(52) U.S. Cl. ..................................... 330/52; 330/151
(58) Field of Search ........................... 330/52, 149, 151

(56) References Cited

U.S. PATENT DOCUMENTS

| | | | | |
|---|---|---|---|---|
| 5,304,945 A | * | 4/1994 | Myer .......................... | 330/149 |
| 5,977,826 A | | 11/1999 | Behan et al. ................ | 330/449 |
| 6,166,600 A | * | 12/2000 | Myer .......................... | 330/151 |
| 6,320,461 B1 | | 11/2001 | Lee ............................. | 330/52 |
| 6,320,464 B1 | * | 11/2001 | Suzuki et al. ................ | 330/52 |

FOREIGN PATENT DOCUMENTS

| | | |
|---|---|---|
| EP | 1003278 A2 | 5/2000 |
| EP | 1041712 A2 | 10/2000 |
| JP | 7-77330 | 8/1995 |
| JP | 2000-286645 | 10/2000 |
| JP | 2000-353923 | 12/2000 |
| WO | WO01/912863 A1 | 11/2001 |

OTHER PUBLICATIONS

Toshio Nojima, et al. "Extremely Low–Distortion Multi––Carrier Amplifier for Mobile Communication Systems––Self–Adjusting Feed–Forward Amplifier" NTT Radio Communication Systems Laboratories, pp. 21–28.

* cited by examiner

Primary Examiner—Khanh Van Nguyen
(74) Attorney, Agent, or Firm—Oblon, Spivak, McClelland, Maier & Neustadt, P.C.

(57) ABSTRACT

In a feedforward amplifier with a dual loop in which a distortion injection path of a distortion elimination circuit 50 is provided as a feedforward configuration composed of a first auxiliary amplifier distortion elimination circuit 60 and a first auxiliary amplifier distortion elimination circuit, a second variable attenuator 55 and a second variable phase shifter 56 are provided preceding the distortion detection circuit 60, a second pilot signal injected between stages of a main amplifier 14 is detected by a directional coupler 85, and the second variable attenuator 55 and the second variable phase shifter 56 are controlled by a second controller 97 to minimize the level of the detected second pilot signal, thereby bringing the distortion elimination circuit and the first auxiliary distortion detection circuit into balance at the same time.

9 Claims, 7 Drawing Sheets

FEEDFORWARD AMPLIFIER WITH DUAL LOOP

BACKGROUND OF THE INVENTION

The present invention relates to a linear amplifier for use mainly in the high-frequency band and, more particularly, to a feedforward amplifier with dual loop, which is provided with a distortion detection circuit for detecting distortion produced by a main amplifier, and a distortion elimination circuit which amplifies the detected distortion component by a first auxiliary amplifier and injects the amplified component into the output from the main amplifier to thereby cancel the distortion component and wherein the distortion elimination circuit comprises a distortion detection circuit which detects a distortion component produced by the first amplifier and a distortion elimination circuit which cancels the detected distortion component by its injection into the first auxiliary amplifier output.

A radio base station for mobile communications employs a feedforward amplifier in a transmitting power amplifier. The feedforward amplifier is composed basically of two signal cancellation circuits, one of which is a distortion detection circuit made up of a signal transfer path of a main amplifier and a linear signal transfer path, and the other of which is a distortion elimination circuit made up of a main signal transfer path and a distortion injection path. The linear signal transfer path is formed by a delay line and a phase inverter circuit. The main signal transfer path is formed by a delay line. The distortion injection path is formed by a variable attenuator, a variable phase shifter and an auxiliary amplifier.

The input signal to the feedforward amplifier is divided by a power divider circuit to the signal transfer path and the linear signal transfer path of the main amplifier. The output signal from the feedforward amplifier is provided by a power combiner which combines outputs from the main signal transfer path and the distortion injecting path. With such a feedforward amplifier, a nonlinear distortion component produced by the main amplifier are detected by the distortion detection circuit and the detected distortion component are eliminated by being injected into the main amplifier output path so that the distortion component and the main amplifier output are opposite in phase but equal in amplitude and delay.

With the recent rapid proliferation of mobile communication, there is now a demand for small, low-power consumption radio equipment for base station use. The base-station radio equipment comprises a modem, a transmitting power amplifier, an antenna, etc. The reduction of the power consumption of the transmitting power amplifier is effective in miniaturization of the radio equipment. To reduce the power consumption of the transmitting power amplifier, it is indispensable to increase the efficiency of the feedforward amplifier. The attainment of high efficiency for the feedforward amplifier requires to increase the efficiencies of the main amplifier and the auxiliary amplifier. The increased efficiency of individual amplifier circuits permits reduction of the power consumption of amplifier. This allows miniaturization of the cooling body of each amplifier and, as a result, enables reduction of the power consumption and downsizing of the transmitting power amplifier.

The efficiency of the main amplifier can be increased using a high-efficiency amplifier such as a class-B push-pull amplifier. In general, when a semiconductor amplifying element of the amplifier is operated under the class-B bias condition, the linearity of the circuit is poorer than under the class-A bias condition. As referred to above, however, the nonlinear distortion component resulting from the application of the class-B bias to the main amplifier of the feedforward amplifier can be eliminated by the conventional feedforward configuration.

On the other hand, to enhance the power efficiency of the auxiliary amplifier inserted in the distortion injection path of the feedforward amplifier, it is necessary, in general, that the semiconductor amplifying element of the auxiliary amplifier be operated under the class-C bias condition. With the above-described feedforward configuration, however, it is impossible to eliminate a nonlinear distortion component produced by the auxiliary amplifier. A solution to this problem is to utilize the feedforward configuration for the distortion injection path including the auxiliary amplifier.

More specifically, the distortion injection path for the auxiliary amplifier is formed by the distortion detection circuit and the distortion elimination circuit, regarding the auxiliary amplifier as a main amplifier. The nonlinear distortion component produced by the auxiliary amplifier is detected by the auxiliary-amplifier distortion detection circuit, and the detected distortion component is eliminated by the auxiliary-amplifier distortion elimination circuit. With this scheme, it is possible to apply to the semiconductor amplifying element of the auxiliary amplifier a high-efficiency-amplification-enabling bias condition other than the class-A bias condition.

Figure 1:
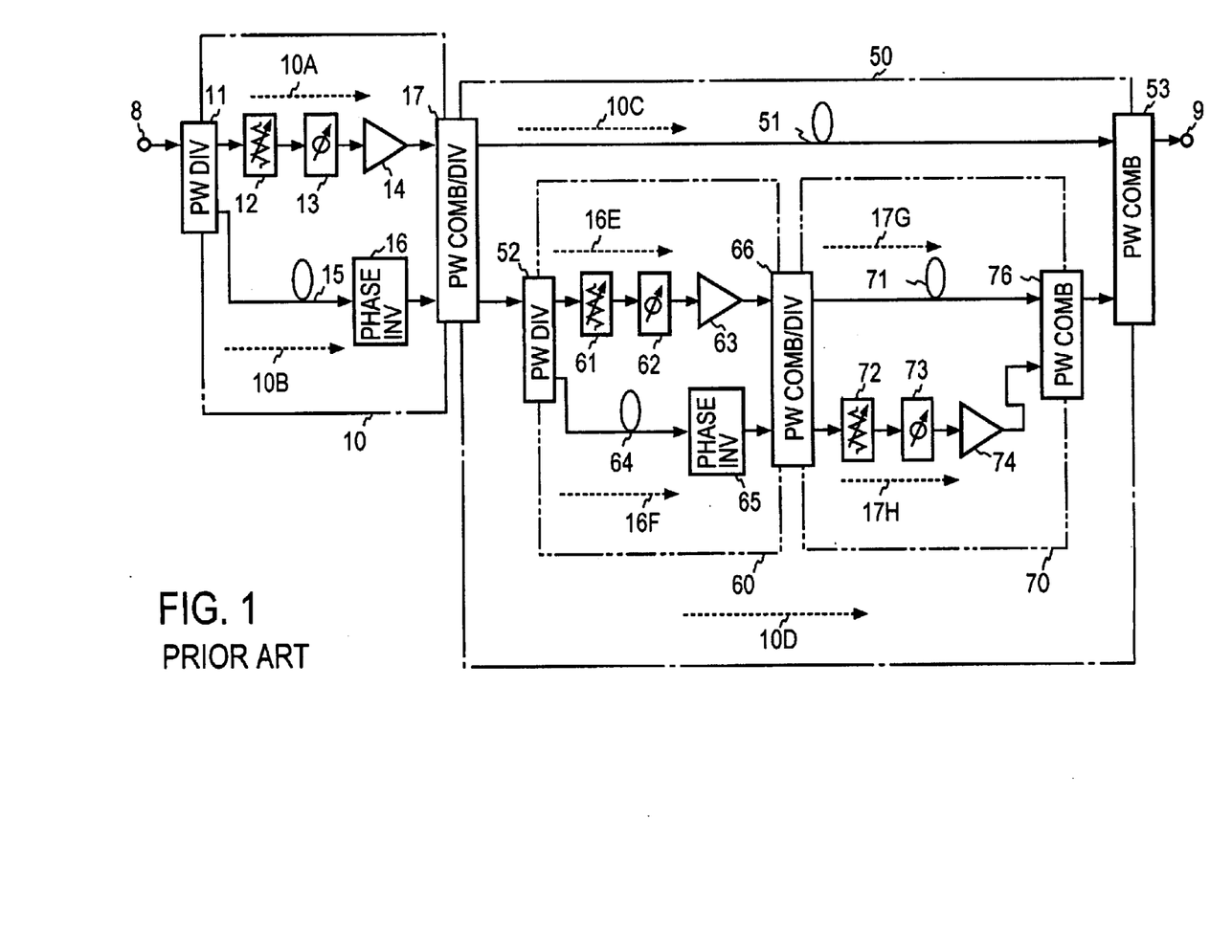
FIG. 1 is a block diagram of a conventional feedforward amplifier.

FIG. 1 illustrates in block form the conventional feedforward amplifier disclosed in Japanese Patent Application Laid Open Gazette 2000-286645 (corresponding U.S. Pat. No. 6,320,461. The illustrated feedforward amplifier is made up of a distortion detection circuit 10 for detecting a distortion component produced by a main amplifier 14 and a distortion elimination circuit 50 for eliminating the detected distortion component.

The distortion detection circuit 10 is formed by a signal transfer path 10A of the main amplifier 14 and a linear signal transfer path 10B. The input signal to the input terminal 8 of the feedforward amplifier is divided by a power divider 11 to the main amplifier signal transfer path 10A including a variable attenuator 12, a variable phase shifter 13 and the main amplifier 14, and to the linear signal transfer path 10B made up of a delay line 15 and a phase inverter circuit 16. The outputs from these two paths 10A and 10B are combined and then divided by a power combiner/divider 17. The divided signals are provided to a main signal transfer path 10C and a distortion injection path 10D which constitute the distortion elimination circuit 50.

The main signal transfer path 10C is formed by a delay line 51. The distortion injection path 10D is comprised of a first auxiliary amplifier distortion detection circuit 60 for detecting a distortion component produced by a first auxiliary amplifier 63, and a first auxiliary amplifier distortion elimination circuit 70 for injecting the detected distortion component into the first auxiliary amplifier output in such a manner as to be opposite in phase but equal in amplitude and delay to each other as referred to previously.

The first auxiliary amplifier distortion detection circuit 60 comprises a first auxiliary amplifier signal transfer path 16E including a variable attenuator 61, a variable phase shifter 62 and the first auxiliary amplifier 63, and a first auxiliary amplifier linear signal transfer path 16F including a delay line 64 and a phase inverter circuit 65. The outputs from these two paths 16E and 16F are combined and then divided by a power combiner/divider 66.

The first auxiliary amplifier distortion elimination circuit 70 comprises a first auxiliary amplifier main signal transfer path 17G formed by a delay line 71, and a first auxiliary amplifier distortion injection path 17H including a variable attenuator 72, a variable phase shifter 73 and a second auxiliary amplifier 74. The outputs from these two paths 17G and 17H are combined by a power combiner 76. The distortion elimination circuit 50 combines the outputs from the main signal transfer path 10C and the distortion injection path 10D by a power combiner 53 to eliminate the distortion component produced by the main amplifier 14, and the combined signal is output as an output signal of the feedforward amplifier to the output terminal 9.

The auxiliary amplifier in the distortion injection path 10D, formed as feedforward amplifier, needs to balance each of four loops; that is, it is necessary to balance the loop of the distortion detection circuit 10, the loop of the first auxiliary amplifier distortion detection circuit 60, the loop of the first auxiliary amplifier distortion elimination circuit 70 and the loop of the distortion elimination circuit 50.

The four loops are respectively required to control sets of variable attenuators and variable phase shifters (12, 13), (61, 62) and (72, 73) so that the output signals from the amplifier signal transfer path and the linear signal transfer path become equal in amplitude and in delay and opposite in phase to each other and so that the output signals from the main signal transfer path and the distortion injection path become equal in amplitude and in delay and opposite in phase to each other. In general, improvement in the nonlinear distortion of the feedforward amplifier depends on the equilibrium of the loops by the adjustment of the variable attenuators and the variable phase shifters. The accuracy of adjustment is described in Japanese Patent Publication Gazette No. 7-77330 entitled "Automatic Adjustment Circuit for Feedforward Amplifier." For example, phase and amplitude deviations (or differences) for providing an amount of distortion compression over 30 dB are within ±2° and within ±0.3 dB, respectively, from which it is seen that precise conditions are imposed on the degree of balance of transmission characteristics and completeness of adjustment of the distortion detection circuit 10 and the distortion elimination circuit 50. In practice, it is not easy to completely maintain the balance of the respective circuits with the distortion detection circuit 10 and the distortion elimination circuit 50. Further, even if initialized perfectly, amplifier characteristics change with variations in ambient temperature, power supply and so forth, making it very difficult to stably maintain the above-mentioned circuits on well-balanced condition for a long period of time.

As a method for maintaining the distortion detection circuit and the distortion elimination circuit of the feedforward amplifier in perfect balance with high accuracy, an automatic adjustment scheme using a pilot signal is set forth, for example, in the afore-mentioned Japanese Patent Publication Gazette No. 7-77330, and a device implementing the scheme is described in Toshio Nojima and Shoichi Narahashi, "Extremely Low-Distortion Multi-Carrier Amplifier for Mobile Communication Systems—Self-Adjusting Feed-Forward Amplifier (SAFF-A)—," Institute of Electronics, Information and Communication Engineers of Japan, Radio Communications Systems Technical Report, RCS90-4, 1990.

Figure 2:
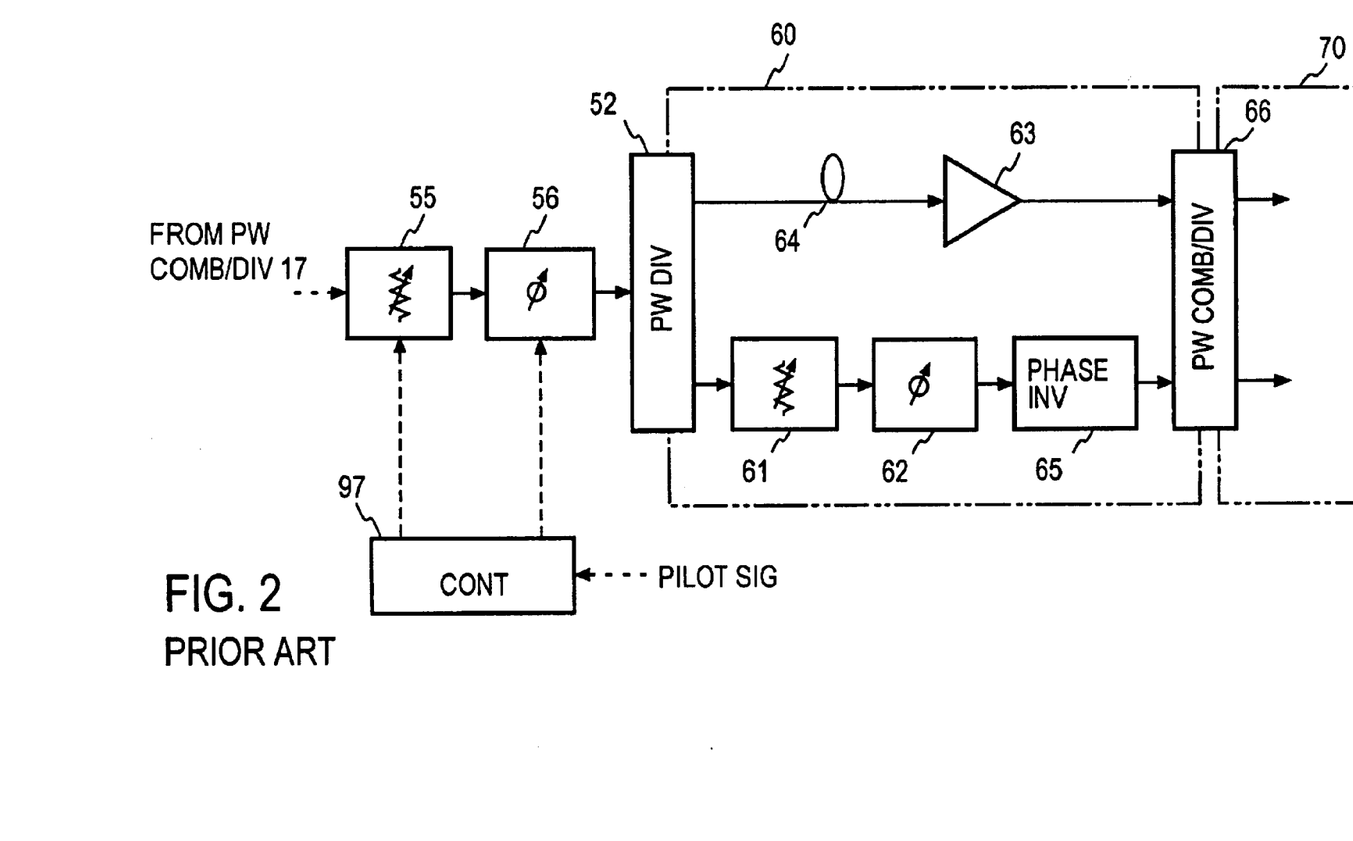
FIG. 2 is a block diagram of the principal part of a modified form of the feedforward amplifier shown in FIG. 1.

A feedforward amplifier with improved stabilization and distortion compensation capabilities is disclosed, for example, in Japanese Patent Application Laid-Open Gazette No. 2000-353923. The feedforward amplifier is a modification of the prior art example of FIG. 1. As shown in FIG. 2, the variable attenuator 61, the variable phase shifter 62 and the delay line 64 of the first auxiliary amplifier distortion detection circuit in FIG. 1 are exchanged in position; a variable attenuator 55 and the a variable phase shifter 56 are provided immediately preceding the first amplifier distortion detection circuit 60; and a pilot signal introduced between stages of the main amplifier 14 is extracted by a directional coupler from the feedforward amplifier output (the output from the power combiner 53) and is detected by a pilot signal detector and controlled by a controller 97 so that its detected level is minimized.

In FIG. 1, the variable attenuator 61 and the variable phase shifter 62 on the input side of the first auxiliary amplifier 63 are shared by the distortion elimination circuit 50 and the first auxiliary amplifier distortion detection circuit 60. This presents a problem that even if the balance of the first auxiliary amplifier distortion detection circuit 60 is achieved by the variable attenuator 61 and the variable phase shifter 62, the balance of the distortion elimination circuit 50 cannot be achieved. Moreover, there is a problem that when the balance of the distortion elimination circuit 50 is achieved, the balance of the first auxiliary amplifier distortion detection circuit 60 cannot be reached.

Further, in such a modified feedforward amplifier as depicted in FIG. 2, when distortion occurs, the control range in the controller 97 becomes a fraction of the amplification factor of the first auxiliary amplifier 63 for the actual distortion range, making it impossible to stably control the pilot signal with high sensitivity.

SUMMARY OF THE INVENTION

It is therefore an object of the present invention to provide a feedforward amplifier which permits easy balance control of the distortion injection path including the feedforward-configured auxiliary amplifier.

The feedforward amplifier with a dual loop according to the present invention comprises:

a distortion detection circuit which includes a main amplifier for amplifying an input signal and detects a nonlinear distortion produced by said main amplifier; and a distortion elimination circuit which includes a first auxiliary amplifier for amplifying the distortion component detected by said distortion detection circuit and cancels the distortion component by injecting the amplified distortion component into the output from said main amplifier;

wherein said distortion elimination circuit constitutes said dual loop including a first auxiliary amplifier distortion detection circuit for detecting a nonlinear distortion produced by said first auxiliary amplifier and a first auxiliary amplifier distortion elimination circuit which has a second auxiliary amplifier for amplifying the distortion component detected by said first auxiliary amplifier distortion detection circuit and cancels the distortion component of said first auxiliary amplifier by injecting the amplified distortion component into the output from said first auxiliary amplifier;

wherein said distortion detection circuit includes first electrical variable attenuator means and first electrical variable phase shifter means inserted in the input path of said main amplifier;

wherein said distortion elimination circuit includes second electrical variable attenuator means and second variable phase shifter means inserted in the input path of said first auxiliary amplifier;

wherein said first auxiliary amplifier distortion elimination circuit includes third electrical variable attenuator means and third electrical variable phase shifter means inserted in the input path of said second auxiliary amplifier;

wherein said first auxiliary amplifier distortion detection circuit includes fourth electrical variable attenuator means and fourth electrical variable phase shifter means inserted in the input path of said first auxiliary amplifier; and said feedforward amplifier further comprising control means which controls said first variable attenuator means, said first variable phase shifter means, said second variable attenuator means, said second variable phase shifter means, said third variable attenuator means, said third variable phase shifter means, said fourth variable attenuator means and said fourth variable phase shifter means to effect balance control of said distortion detection circuit, said distortion elimination circuit, said first auxiliary amplifier distortion detection circuit and said first auxiliary amplifier distortion elimination circuit.

According to the present invention, in the feedforward amplifier with a dual loop, the loop balance of the first auxiliary amplifier distortion detection circuit is controlled by the variable attenuator and the variable phase shifter inserted in the input path of the first auxiliary amplifier and the loop balance of the distortion elimination circuit is controlled by the variable attenuator and the variable phase shifter inserted in the input path of the first auxiliary amplifier distortion detection circuit. This brings the distortion elimination circuit into balance without affecting the balance of the first auxiliary amplifier distortion detection circuit, permitting compensation for the distortion component generated by the main amplifier and compensation for the distortion component produced by the first auxiliary amplifier.

DETAILED DESCRIPTION OF THE PREFERRED EMBODIMENTS

Figure 3:
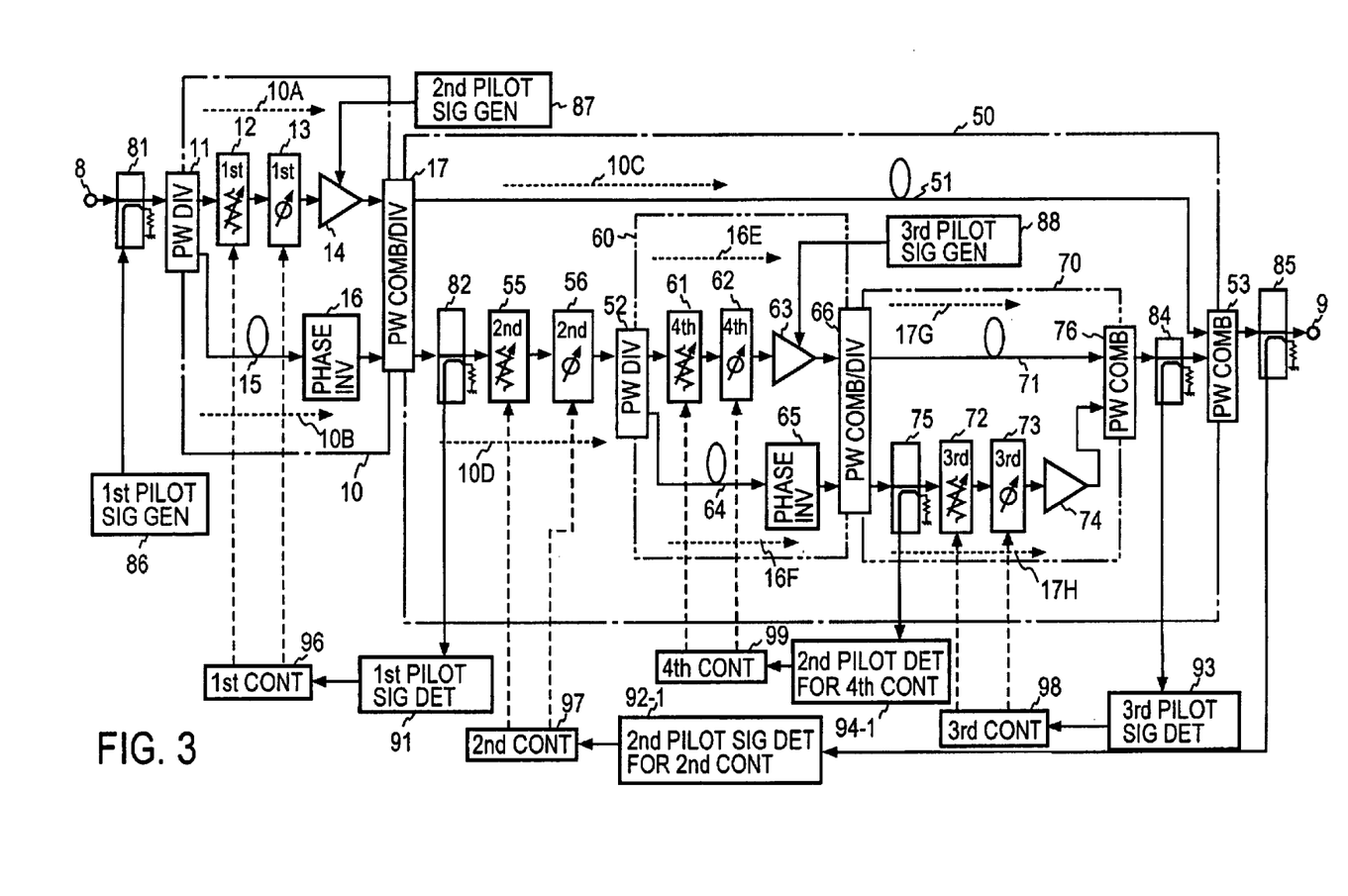
FIG. 3 is a block diagram of a feedforward amplifier according to a first embodiment of the present invention.

FIG. 3 illustrates in block form a first embodiment of the feedforward amplifier according to the present invention, which uses three pilot signals and four control means.

As is the case with the feedforward amplifier of FIG. 1, the feedforward amplifier of this embodiment has the distortion detection circuit 10 and the distortion elimination circuit 50, and with a view to canceling the distortion produced by the first auxiliary amplifier 63 of the distortion elimination circuit 50, the first auxiliary amplifier 63 is feedforward-configured by providing the first auxiliary amplifier distortion detection circuit 60 and the first auxiliary amplifier distortion elimination circuit 70 in the distortion injection path 10D. The distortion detection circuit 10 comprises: the power divider 11 for dividing the amplifier input signal to the main amplifier signal path 10A and the linear signal transfer path 10B; the first variable attenuator 12, the variable phase shifter 13 and the main amplifier 14 inserted in the main amplifier signal path 10A; the delay line 15 and the phase inverter circuit 16 forming the linear signal transfer path 10B; and the power combiner/divider 17 which combines the outputs from the two paths 10A and 10B and then divides the combined output to two paths.

The signals divided by the power combiner/divider 17 are input to the delay line 51 forming the main signal transfer path 10C and the distortion injection path 10D in the distortion elimination circuit 50. In this embodiment, there are inserted in the distortion injection circuit 10D a directional coupler 82, a second variable attenuator 55, a second variable phase shifter 56, the first auxiliary amplifier distortion detection circuit 60, the first auxiliary amplifier distortion elimination circuit 70 and a directional coupler 84.

The first auxiliary amplifier distortion detection circuit 60 comprises: the power divider 52 for dividing the output from the second variable phase shifter 56 to the first auxiliary amplifier signal transfer path 16E and the first auxiliary amplifier linear signal transfer path 16F; a fourth variable attenuator 61, a fourth variable phase shifter 62 and the first auxiliary amplifier 63 inserted in the first auxiliary amplifier signal transfer path 16E; the delay line 64 and the phase inverter circuit 63 forming the first auxiliary amplifier linear signal transfer path 16F; and the power combiner/divider 66 for combining the outputs from the two paths 16E and 16F and then dividing the combined output to two paths.

The first auxiliary amplifier distortion elimination circuit 70 comprises: the first auxiliary amplifier main signal path 17G which is formed by the delay line and supplied with one of the two signals divided by the power combiner/divider 66; the first auxiliary amplifier distortion injection path 17H which is formed by a directional coupler 73, a third variable attenuator 72 and a third variable phases shifter 73 and is supplied with the other divided signal from the power combiner/divider 66; and the power combiner 76 which combines the outputs from the paths 17G and 17H and provides the combined output via the directional coupler 84 to the power combiner 53.

As means for adjusting the balance of the respective loops, there are provided: a first pilot signal generator 86 for generating a first pilot signal; a directional coupler 81 provided on the input side of the power divider 11 for introducing the first pilot signal into the input thereto; a second pilot signal generator 87 for generating and introducing a second pilot signal into between stages of the main amplifier 14; and a third pilot signal generator 88 for generating and introducing a third pilot signal into between stages of the first auxiliary amplifier 63.

There are provided a first pilot signal detector 91 for detecting the level of the first pilot signal extracted via the directional coupler 82 and a first controller 96 supplied with the detected level, for controlling the first variable attenuator 12 and the first variable phase shifter 13 to minimize the detected signal level.

Further, there are provided a second pilot signal detector 94-1 for detecting the level of the second pilot signal extracted via the directional coupler 75 and a fourth controller 99 for controlling the fourth variable attenuator 61 and the fourth variable phase shifter 62 to minimize the detected signal level. Further, there are provided a second pilot signal detector 92-1 for detecting the level of the second pilot signal extracted via a directional coupler 85 and a second controller 97 for controlling the second variable attenuator 55 and the second variable phase shifter 56 to minimize the detected signal level.

According to the present invention, by controlling the variable attenuator 55 and the variable phase shifter 56 inserted in series in the distortion injection path 10D of the distortion elimination circuit 50 which is the input path to the first auxiliary amplifier distortion detection circuit 60, it is possible to effect balance control of the loop of the distortion elimination circuit 50 without affecting the balance of the loop of the first auxiliary amplifier distortion detection circuit 60. Besides, since the balance control of the loop of the first auxiliary amplifier distortion detection circuit 60 is performed by the fourth variable attenuator 61 and the fourth variable phase shifter 62 inserted in the same signal transfer path as that in which the first auxiliary amplifier 63 is inserted, there is no need for such a wide range of variation as is required for the variable attenuator 61 and the variable phase shifter 62 in the FIG. 2 prior art example.

The feedforward amplifier of the FIG. 3 embodiment brings the distortion detection circuit 10, the first auxiliary amplifier distortion detection circuit 60, the first auxiliary amplifier distortion elimination circuit 70 and the distortion elimination circuit 50 into balance by use of three pilot signals. That is, the feedforward amplifier establishes the balance of the loop of the distortion detection circuit 10 by applying the first pilot signal to the first variable attenuator 12 and the first variable phase shifter 13 to control them and the balance of the loop of the first auxiliary amplifier distortion detection circuit 60 by applying the second pilot signal to the fourth variable attenuator 61 and the fourth phase shifter 62 to control them. The balance of the loop of the distortion elimination circuit 50 is established by applying the second pilot signal to the second variable attenuator 55 and the second variable phase shifter 56 to control them after the loop of the first auxiliary amplifier distortion detection circuit 60 is brought into balance. The balance of the loop of the first auxiliary amplifier distortion elimination circuit 70 can be acquired by applying the third pilot signal to the third variable attenuator 72 and the third variable phase shifter 73 to control them. In this way, the respective loops of the distortion elimination circuit and the first auxiliary amplifier distortion detection circuit are brought into balance. Since it is considered that in the first auxiliary amplifier distortion elimination circuit 70 only the delay line 71 affects the amplitude and phase of the distortion cancellation signal which is introduced into the power combiner 53, the third variable attenuator 72 and the third variable phase shifter 73 can be adjusted at any stage of the balance adjustment for the other loops.

Figure 4:
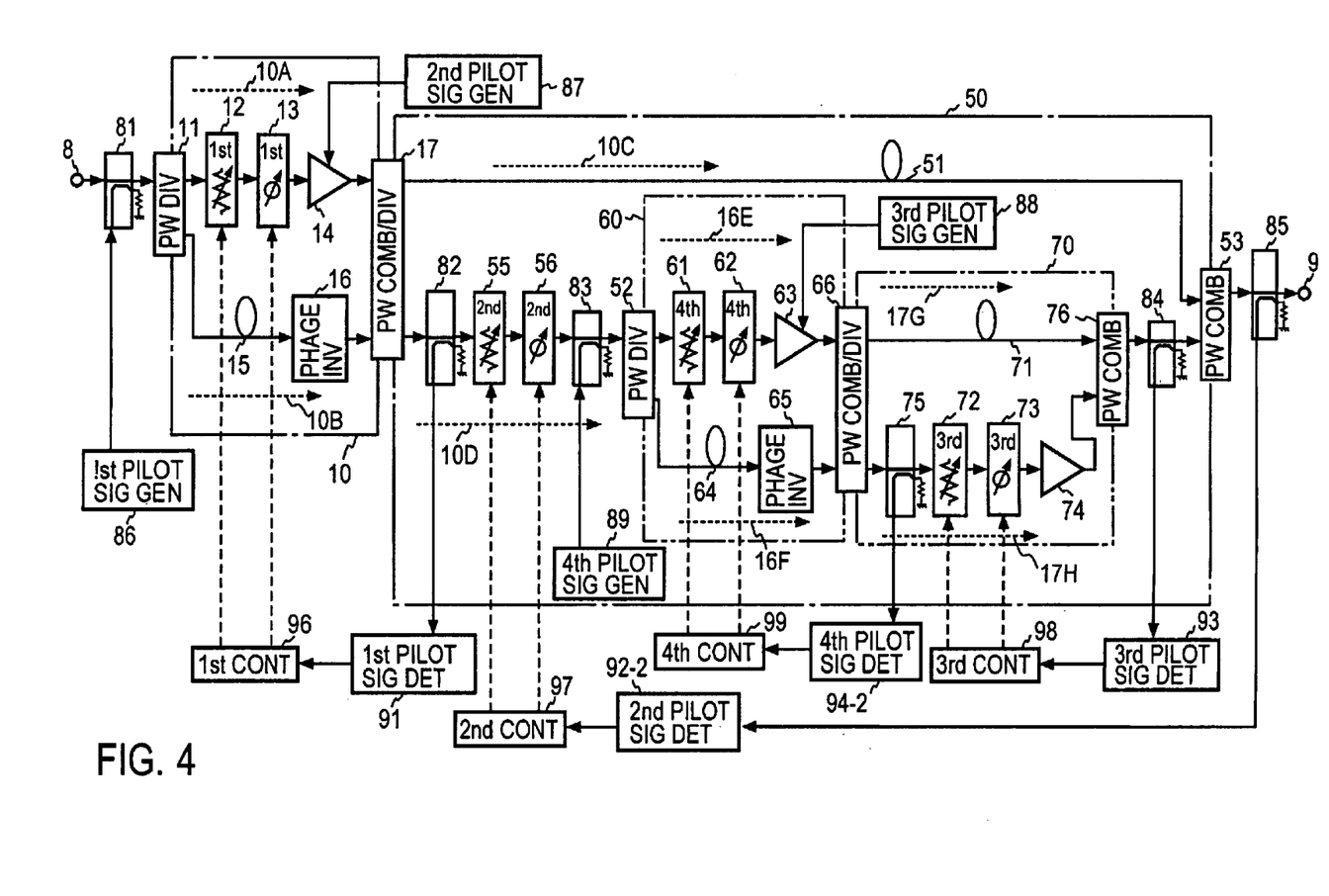
FIG. 4 is a block diagram of a feedforward amplifier according to a second embodiment of the present invention.

FIG. 4 illustrates in block form a second embodiment of the feedforward amplifier according to the present invention, which is configured to use four pilot signals and four control means. While in the FIG. 3 embodiment the second pilot signal is used in common to the adjustment of the second variable attenuator 55 and the second variable phase shifter 56 and the adjustment of the fourth variable attenuator 61 and the fourth variable phase shifter 62, the FIG. 4 embodiment generates a fourth pilot signal dedicated to the adjustment of the fourth variable attenuator 61 and the fourth variable phase shifter 62, and introduces the fourth pilot signal into the input side of the first auxiliary amplifier distortion detection circuit 60.

That is, in the feedforward amplifier of this embodiment, a directional coupler 83 is inserted in the distortion injection path 10D on the input side of the first auxiliary amplifier distortion detection circuit 60 and the fourth pilot signal generated by a fourth pilot signal generator 89 is provided via the directional coupler 83 to the first auxiliary amplifier distortion detection circuit 60. Further, the fourth pilot signal is extracted via the directional coupler 75 of the first auxiliary amplifier distortion elimination circuit 70, then the level of the fourth pilot signal is detected by a fourth pilot signal detector 94-2, and based on the detected level, the fourth variable attenuator 61 and the variable phase shifter 62 are controlled by the fourth controller 99. Since this arrangement is the same as in the FIG. 3 embodiment, no description will be repeated.

Figure 5A:
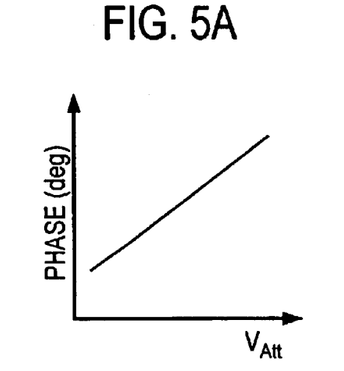
FIG. 5A is a graph for explaining a general characteristic of a variable attenuator.
Figure 5B:
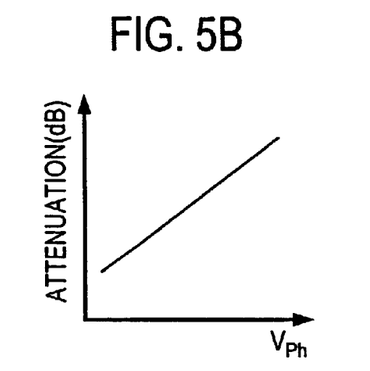
FIG. 5B is a graph for explaining a general characteristic of a variable phase shifter.
Figure 6:
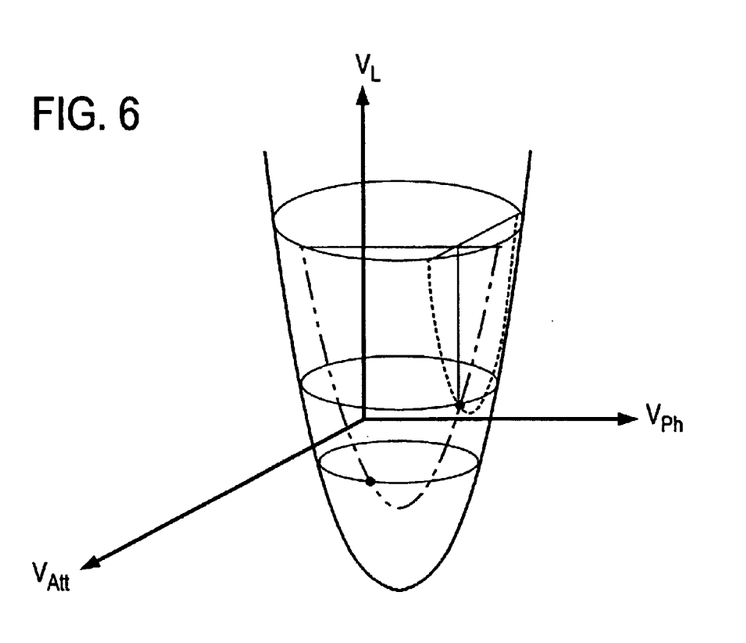
FIG. 6 is a diagram for explaining balance control by the variable attenuator and the variable phase shifter.

The variable attenuators and the variable phase shifters in the embodiments of FIGS. 3 and 4 usually have characteristics that the attenuation and the phase shift amount monotonously increase as control voltages $V_{Att}$ and $V_{Ph}$ increase as depicted in FIGS. 5A and 5B. The relationships among control voltages $V_{Att}$ and $V_{Ph}$ for the variable attenuator and the variable phase shifter and the level $V_L$ of the pilot signal detected by the pilot signal detector is expressed by a surface of revolution (hereinafter referred to as a paraboloid of revolution) formed by revolving a substantially parabolic curve about a straight line parallel to the $V_L$-axis on three orthogonal coordinates $V_{Att}$, $V_{Ph}$ and $V_L$ as shown in FIG. 6.

In balance control of the loop by a digital processor, for example, the phase shift amount control voltage $V_{Ph}$ is fixed at an arbitrary value, and on a parabola formed by cutting the paraboloid of revolution by a plane vertical to the $V_{Ph}$-axis passing through the fixed value of the phase shift amount control voltage $V_{Ph}$, the attenuation control voltage $V_{Att}$ is changed in a direction in which to decrease the detected pilot signal level $V_L$ and is fixed, and on a parabola formed by cutting the paraboloid of revolution by a plane vertical to the $V_{Att}$-axis passing through the fixed value of the attenuation control voltage $V_{Att}$, the phase shift amount control voltage $V_{Ph}$ is changed in a direction in which to decrease in the detected pilot signal level $V_L$. Such a procedure is repeated and the balance control is discontinued at the time when the detected pilot signal level $V_L$ goes down below a reference value.

In balance control of the loop by an analog control circuit, the detected pilot signal level at which the distortion component in the transmission signal becomes lower than a predetermined value is set as a reference voltage $V_R$, and a difference voltage $V_L - V_R$ between the detected pilot signal level $V_L$ and the reference voltage $V_R$ is applied as the attenuation control voltage $V_{Att}$ and the phase shift amount control voltage $V_{Ph}$ from the control circuit to the variable attenuator and the variable phase shifter to effect their feedback control, and the control voltages are fixed at voltage values at the time the difference voltage $V_L - V_R$ is reduced to zero.

Since a common control algorithm can be used for the first to fourth controllers in the embodiments of FIGS. 3 and 4 which are common in that they minimize the detected pilot signal level (or reduce the level down to a value smaller than the reference value), the controllers can also be implemented by a single controller which controls the variable attenuators and the variable phase shifters on a time-division basis. This controller sharing contributes to the reduction of power consumption. The control algorithm may be such a conventional application algorithm as a perturbation method or least square estimation method. The balance of the loop of the feedforward amplifier changes, in general, with a variation in the power supply voltage or device temperature. The change speed of the loop balance to time is relatively low. Hence, a control algorithm, even if consuming much time for convergence to an optimum value, can sufficiently deal with control of the feedforward amplifier with a dual loop according to the present invention.

The pilot signals may be non-modulated or modulated waves set to different frequencies, or waves set to the same frequency but spread by different spreading codes. A pilot signal detector for detected the non-modulated pilot signal is formed using a narrow-band level detector. For example, a band-pass filter for limits the pass band of the detected signal and a diode or similar level detector are used for the pilot signal detector. A pilot signal detector for detecting the modulated pilot signal is formed by a frequency converter for frequency converting the detected pilot signal to a base band signal and a demodulator for demodulating the frequency-converted base band signal. In contrast to the non-modulated pilot signal, since the modulated pilot signal is demodulated, equalization processing, error correcting processing and so forth can be used to deal with various kinds of interference, noise and so on—this enables the balance of each loop to be established with less power necessary for the pilot signal. A pilot signal detector for detecting the spread pilot signal is made up of a frequency converter for down-converting the pilot signal to a base band signal, a de-spreader for de-spreading the base band signal, and a demodulator for demodulating the de-spread signal. Thus, the automatic adjustment scheme for the feedforward amplifier according to the present invention is applicable to various pilot signals. Various pilot signal generators and pilot signal detectors applicable to the feedforward amplifier of the present invention are described, for example, in U.S. Pat. No. 6,208,204.

Figure 7:
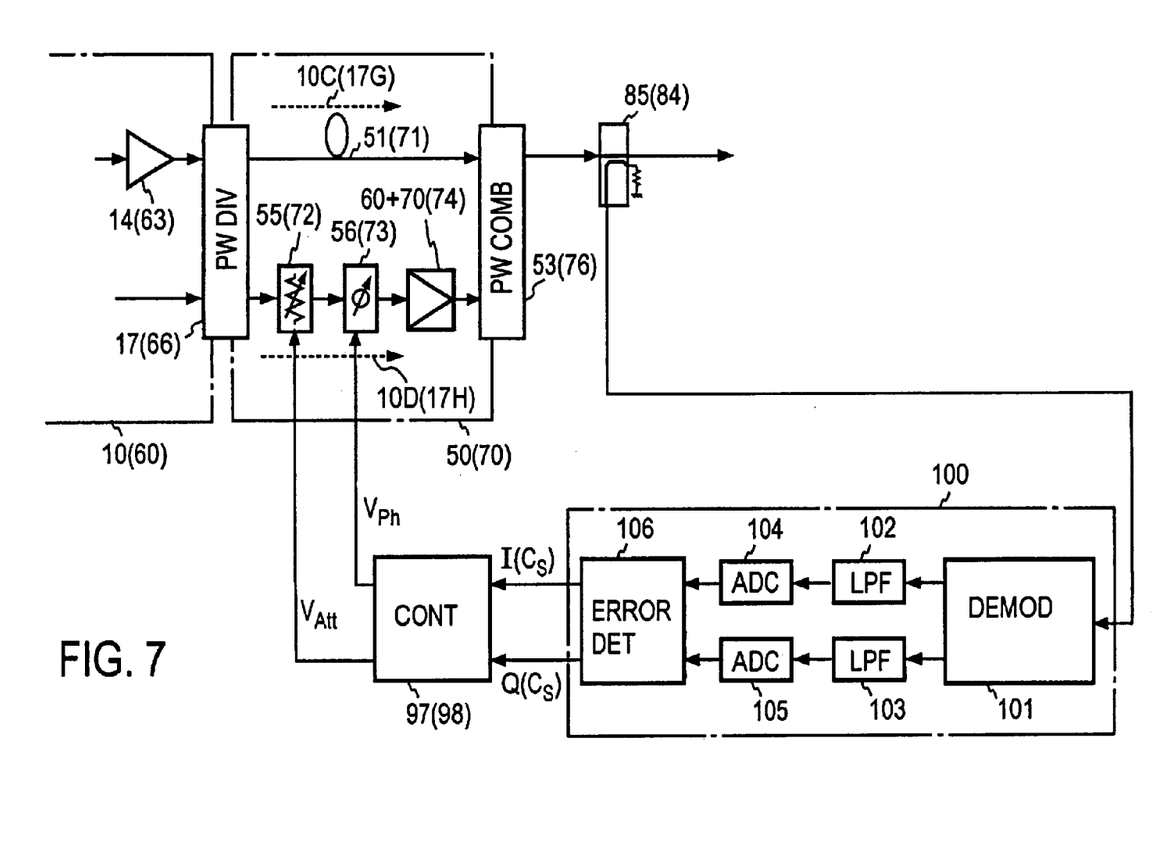
FIG. 7 is a block diagram depicting the principal part of an arrangement for effecting loop balance control based on an IQ demodulated output.

While the embodiments of FIGS. 3 and 4 have been described to use the pilot signals for balance control of the four loops, it is also possible to effect the balance control without using the pilot signals. The balance of the loop of each of the distortion elimination circuits (50 and/or 70), for instance, can be adjusted without using the second and/or third pilot signal. FIG. 7 depicts the principal part of an arrangement which does not use the second pilot signal in the embodiments of FIGS. 3 and 4. As shown in FIG. 7, the second signal generator 87 in FIGS. 3 and 4 is not provided and the second pilot signal detector 92-2 replaced with an error signal detection circuit 100, and based on the detected error signal, the second controller 97 controls the second variable attenuator 55 and the second variable phase shifter 56.

The error detection circuit 100 in this example comprises a demodulator 101, low-pass filters 102 and 103 to which IQ signals are demodulated input signal in the demodulator 101, analog-digital converters 104 and 105, and an error signal detector 106.

The transmission signal containing distortion components is extracted by the directional coupler 85, from which it is provided to the demodulator 101. The demodulator 101 simultaneously detects the transmission signal and distortion components produced due to the nonlinear characteristic of the main amplifier 14, and outputs in-phase (I) and quadrature (Q) signals. The low-pass filters 102 and 103 eliminate high-frequency components from input signal components to the analog-digital converters 104 and 105. The analog-digital converters 104 and 105 convert the band-limited I and Q signals to digital form. This embodiment has been described to use the analog-digital converters 104 and 105 since it performs the error signal detection by digital signal processing, but in the case of using an analog signal for the error signal detection, the analog-digital converters 104 and 105 are unnecessary.

Figure 8A:
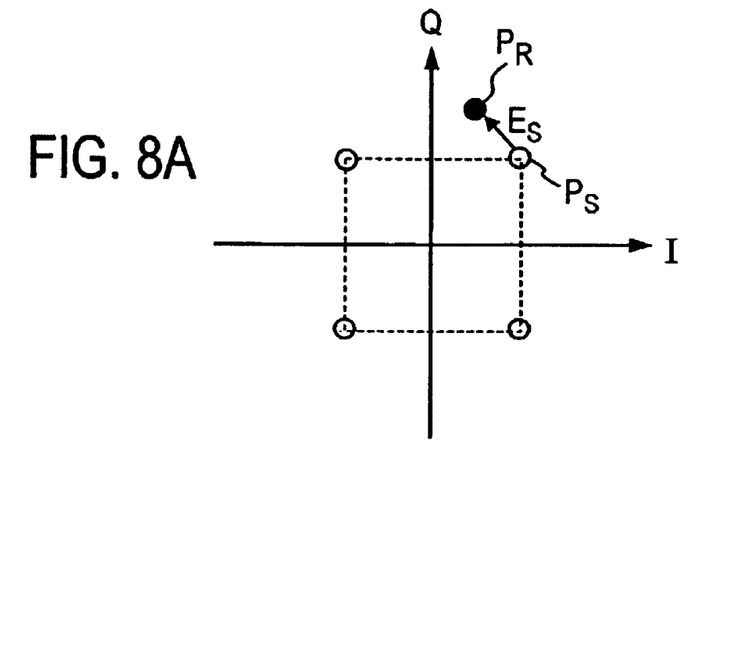
FIG. 8A is a graph for explaining an error signal detection by IQ demodulation.
Figure 8B:
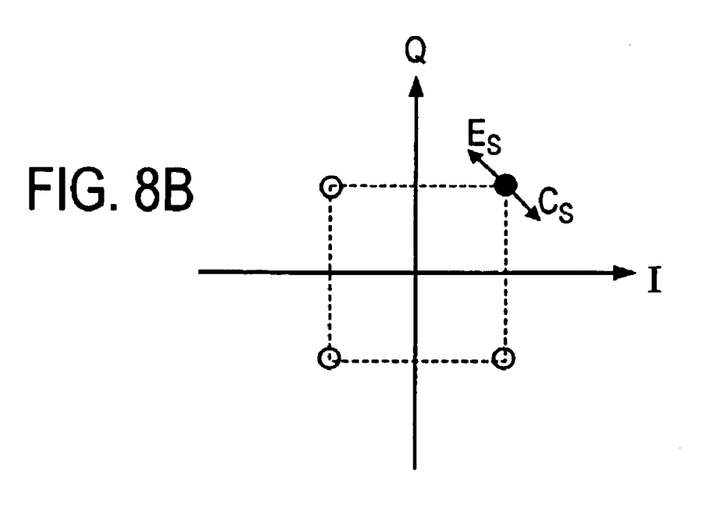
FIG. 8B is a graph for explaining a correction signal which is generated from an error signal.

The error signal detector 106 decides the transmission signal containing nonlinear components. For example, when the transmission signal is a QPSK-modulated signal, the error detector 106 detects, as an error signal $E_S$ indicating the distortion component in the transmitting signal, the difference between a correct transmission signal point $P_S$ and a demodulated signal point $P_R$ as depicted in FIG. 8A, then generates a correcting signal $C_S$ of a vector equal in absolute value to the detected error signal $E_S$ in a direction opposite thereto as shown in FIG. 8B, and provides the correcting signal $C_S$ as I and Q components $I(C_S)$ and $Q(C_S)$ to the controller 97. The controller 97 amplitude/phase converts the correcting signal to generate an amplitude control signal $V_{At}$ as a control signal for the variable attenuator 55 and a phase control signal $V_{Ph}$ as a control signal for the variable phase shifter 56. In the controller 97 the amplitude control signal $V_{At}$ is calculated by a square root, $(I(C_S)^2+Q(C_S)^2)^{1/2}$, of the sum of squares of the signals $I(C_S)$ signal and $Q(C_S)$ provided from the error signal detector 106. The phase control signal $V_{Ph}$ is calculated by $\tan^{-1}(Q(C_S)/I(C_S))$ from the signals $I(C_S)$ and $Q(C_S)$ provided from the error signal detector 106.

Similarly, as indicated by the reference numerals in parentheses in FIG. 7, the first auxiliary amplifier distortion elimination circuit 70 in FIGS. 3 and 4 can also be configured to control the third variable attenuator 72 and the third variable phase shifter 73 without using the third pilot signal. That is, a distortion cancellation signal, produced by the distortion injection path 10D supplied with the distortion components generated by the first auxiliary amplifier 63, is extracted by the directional coupler 84, and the extracted distortion cancellation signal is subjected to demodulation by the error signal detection circuit 100 to generate correcting signals $I(C_S)$ and $Q(C_S)$, which are provided to the controller 98, which, in turn, controls the third variable attenuator 72 and the third variable phase shifter 73 based on the correcting signals $I(C_S)$ and $Q(C_S)$. Further, both of the distortion elimination circuit 50 and the first auxiliary amplifier distortion elimination circuit 70 can also be configured to use the demodulation scheme described above with reference to FIG. 7.

In the embodiments of FIGS. 3, 4 and 7, the controllers 96 to 99 each control the respective pair of variable attenuator and variable phase shifter to minimize the detected pilot signal level or IQ-demodulated distortion component; in practice, each controller compares a predetermined reference level and the detected pilot signal level, and controls the variable attenuator and the variable phase shifter 56 on a stepwise basis until the pilot signal level goes down below the reference level. Such a control algorithm can be implemented by the conventional perturbation method, least square estimation method or the like.

The controllers 96 to 99 may each be formed by a digital processing unit using a microprocessor or an analog calculation circuit. In either case, it is preferable from the view-point of efficient balance control that the balance control of the loop of the distortion elimination circuit 50 be preceded by the balance control of the loop of the first auxiliary amplifier distortion detection circuit 60, but balance control of the other loops (the loops of the distortion detection circuit 10 and the first auxiliary amplifier distortion elimination circuit 70) may be at any desired stages of processing. This somewhat impairs the efficiency of balance control, but allows each of the controllers 96 to 99 to effect the balance control independently of the others.

The feedforward amplifier of the first embodiment of the present invention described above is a feedforward amplifier with a dual loop which is provided with a distortion detection circuit for detecting a nonlinear distortion produced by a main amplifier and a distortion elimination circuit which amplifies the detected distortion component by a first auxiliary amplifier and then introduces the amplified distortion components into the output from said main amplifier, said distortion elimination circuit being formed by a first auxiliary amplifier distortion detection circuit for detecting a nonlinear distortion produced by said first auxiliary amplifier of said distortion elimination circuit and a first auxiliary amplifier distortion elimination circuit which amplifies the distortion component detected by said first auxiliary amplifier distortion detection circuit and then introduces the amplified distortion component into the output from said first auxiliary amplifier to cancel the distortion component generated by said first auxiliary amplifier, said feedforward amplifier comprising:

first pilot signal injecting means inserted in an input path to said distortion detection circuit, for injecting thereinto a first pilot signal;

first electrical variable attenuator means and first electrical variable phase shifter means inserted in a main amplifier input path of said distortion detection circuit;

first pilot signal detecting means inserted in an input path to said first auxiliary amplifier distortion detection circuit;

a first controller supplied with an output signal from said first pilot signal detecting means, for controlling said first electrical variable attenuator means and said first electrical variable phase shifter means;

second pilot signal injecting means inserted between stages of said main amplifier, for injecting thereinto a second pilot signal;

second electrical variable attenuator means and second electrical variable phase shifter means inserted in an input path to said first auxiliary amplifier distortion detection circuit;

second pilot signal detecting means for second controller use inserted in an output path from said distortion elimination circuit;

a second controller supplied with an output signal from said second pilot signal detecting means, for controlling said second electrical variable attenuator and said second electrical variable phase shifter;

third pilot signal injecting means inserted between stages of said first auxiliary amplifier, for injecting thereinto a third pilot signal;

third electrical variable attenuator means and third electrical variable phase shifter means inserted in an input path to a second auxiliary amplifier of said first auxiliary amplifier distortion elimination circuit;

third pilot signal detecting means inserted in an output path from said first auxiliary amplifier distortion elimination circuit;

a third controller supplied with the output from said third pilot signal detecting means, for controlling said third electrical variable attenuator means and said third electrical variable phase shifter means;

fourth electrical variable attenuator means and fourth electrical variable phase shifter means inserted in an input path to said first auxiliary amplifier;

second pilot signal detecting means for fourth controller use inserted in an input path to said second auxiliary amplifier of said first auxiliary amplifier distortion elimination circuit;

a fourth controller supplied with the output from said second pilot signal detecting means for fourth controller use, for controlling said fourth electrical variable attenuator means and said fourth electrical variable phase shifter means; and control means for controlling said first electrical variable attenuator means and said first electrical variable phase shifter means by said first controller on a stepwise basis to minimize the, level of said first pilot signal detected by said first pilot signal detecting means, for controlling said fourth electrical variable attenuator means and said fourth electrical variable phase shifter means by said fourth controller on a stepwise basis to minimize the level of said second pilot signal level detected by said second pilot signal detecting means for fourth controller use, for controlling said third electrical variable attenuator means and said third electrical variable phase shifter means by said third controller on a stepwise basis to minimize the level of said third pilot signal detected by said third pilot signal detecting means, and for controlling said second electrical variable attenuator means and said second electrical variable phase shifter means by said second controller on a stepwise basis to minimize the level of said second pilot signal level detected by said second pilot signal detecting means for fourth controller use.

The feedforward amplifier of the second embodiment of the present invention described above is a feedforward amplifier with a dual loop which is provided with a distortion detection circuit for detecting a nonlinear distortion produced by a main amplifier and a distortion elimination circuit which amplifies the detected distortion component by a first auxiliary amplifier and then introduces the amplified distortion components into the output from said main amplifier, said distortion elimination circuit being formed by a first auxiliary amplifier distortion detection circuit for detecting a nonlinear distortion produced by said first auxiliary amplifier of said distortion elimination circuit and a first auxiliary amplifier distortion elimination circuit which amplifies the distortion component detected by said first auxiliary amplifier distortion detection circuit and then introduces the amplified distortion component into the output from said first auxiliary amplifier to cancel the distortion component generated by said first auxiliary amplifier, said feedforward amplifier comprising:

first pilot signal injecting means inserted in an input path to said distortion detection circuit, for injecting thereinto a first pilot signal;

first electrical variable attenuator means and first electrical variable phase shifter means inserted in a main amplifier input path of said distortion detection circuit;

first pilot signal detecting means inserted in an input path to said first auxiliary amplifier distortion detection circuit;

a first controller supplied with an output signal from said first pilot signal detecting means, for controlling said first electrical variable attenuator means and said first electrical variable phase shifter means;

second pilot signal injecting means inserted between stages of said main amplifier, for injecting thereinto a second pilot signal;

second electrical variable attenuator means and second electrical variable phase shifter means inserted in an input path to said first auxiliary amplifier distortion detection circuit;

second pilot signal detecting means inserted in an output path from said distortion elimination circuit;

a second controller supplied with an output signal from said second pilot signal detecting means, for controlling said second electrical variable attenuator and said second electrical variable phase shifter;

third pilot signal injecting means inserted between stages of said first auxiliary amplifier, for injecting thereinto a third pilot signal;

third electrical variable attenuator means and third electrical variable phase shifter means inserted in an input path to a second auxiliary amplifier of said first auxiliary amplifier distortion elimination circuit;

fourth pilot signal injecting means inserted in the input path to said first auxiliary amplifier distortion detection circuit;

fourth electrical variable attenuator means and fourth electrical variable phase shifter means inserted in in an input path to said first auxiliary amplifier;

third pilot signal detecting means inserted in an output path from said first auxiliary amplifier distortion elimination circuit;

a third controller supplied with the output from said third pilot signal detecting means, for controlling said third electrical variable attenuator means and said third electrical variable phase shifter means;

fourth pilot signal detecting means inserted in an input path to said second auxiliary amplifier of said first auxiliary amplifier distortion elimination circuit;

fourth electrical variable attenuator means and fourth electrical variable phase shifter means inserted in an input path to said first auxiliary amplifier;

a fourth controller supplied with the output from said fourth pilot signal detecting means, for controlling said fourth electrical attenuator means and said fourth electrical variable phase shifter means; and control means for controlling said first electrical variable attenuator means and said first electrical variable phase shifter means by said first controller on a stepwise basis to minimize the level of said first pilot signal detected by said first pilot signal detecting means, for controlling said second electrical variable attenuator means and said second electrical variable phase shifter means by said second controller on a stepwise basis to minimize the level of said second pilot signal level detected by said second pilot signal detecting means, for controlling said third electrical variable attenuator means and said third electrical variable phase shifter means by said third controller on a stepwise basis to minimize the level of said third pilot signal detected by said third pilot signal detecting means, and for controlling said fourth electrical variable attenuator means and said fourth electrical variable phase shifter means by said fourth controller on a stepwise basis to minimize the level of said fourth pilot signal level detected by said fourth pilot signal detecting means.

Effect of the Invention

As described above, the feedforward amplifier with a dual loop according to the present invention permits implementation of balance control of the loop of the distortion elimination circuit 50 without affecting the balance of the loop of the first auxiliary amplifier distortion detection circuit 60 by controlling the variable attenuator 55 and the variable phase shifter 56 inserted in series in the input path to the first auxiliary amplifier distortion detection circuit in the distortion injection path 10D of the distortion elimination circuit 50. Furthermore, since the balance control of the loop of the first auxiliary amplifier distortion detection circuit 60 is effected by the fourth variable attenuator 61 and the variable phase shifter 62 inserted in the signal transfer path 16E in which the first auxiliary amplifier 63 is also inserted, there is no need for such a wide range of variation as required for each of the variable attenuator 61 and the variable phase shifter 62 in the FIG. 2 prior art example.

The present invention provides the following advantages over the prior art.

(1) An automatic adjustment scheme for the feedforward amplifier with a dual loop which permits high-efficiency amplification can be offered.

(2) A stable distortion compensation capability can be implemented.

(3) The above features (1) and (2) enables reduction of the power consumption of the feedforward amplifier, permitting implementation of a small and economical system.

(4) The provision of the variable attenuator and the variable phase shifter on the input side of the first auxiliary amplifier enables the variable attenuator and the variable phase shifter to be controlled control range to be controlled according to the range of distortion of the input distortion signal, providing increased accuracy and stability in the automatic balance control of the loop.

What is claimed is:

1. A feedforward amplifier comprising:

a distortion detection circuit which includes a main amplifier for amplifying an input signal and detects a nonlinear distortion produced by said main amplifier; and a distortion elimination circuit which includes a first auxiliary amplifier for amplifying the distortion component detected by said distortion detection circuit and cancels the distortion component by injecting the amplified distortion component into the output from said main amplifier;

wherein said distortion elimination circuit constitutes a dual loop including a first auxiliary amplifier distortion detection circuit for detecting a nonlinear distortion produced by said first auxiliary amplifier and a first auxiliary amplifier distortion elimination circuit which has a second auxiliary amplifier for amplifying the distortion component detected by said first auxiliary amplifier distortion detection circuit and cancels the distortion component of said first auxiliary amplifier by injecting the amplified distortion component into the output from said first auxiliary amplifier;

wherein said distortion detection circuit includes first electrical variable attenuator means and first electrical variable phase shifter means inserted in the input path of said main amplifier;

wherein said distortion elimination circuit includes second electrical variable attenuator means and second variable phase shifter means inserted in the input path of said first auxiliary amplifier;

wherein said first auxiliary amplifier distortion elimination circuit includes third electrical variable attenuator means and third electrical variable phase shifter means inserted in the input path of said second auxiliary amplifier;

wherein said first auxiliary amplifier distortion detection circuit includes fourth electrical variable attenuator means and fourth electrical variable phase shifter means inserted in the input path of said first auxiliary amplifier; and said feedforward amplifier further comprising control means which controls said first variable attenuator means, said first variable phase shifter means, said second variable attenuator means, said second variable phase shifter means, said third variable attenuator means, said third variable phase shifter means, said fourth variable attenuator means and said fourth variable phase shifter means to effect balance control of said distortion detection circuit, said distortion elimination circuit, said first auxiliary amplifier distortion detection circuit and said first auxiliary amplifier distortion elimination circuit.

2. The feedforward amplifier of claim 1, further comprising: first pilot signal injecting means inserted in the input path of said distortion detection circuit, for injecting thereinto a first pilot signal; and first pilot signal extracting means inserted in the input path of said first auxiliary amplifier distortion detection circuit, for extracting said first pilot signal;

wherein said control means controls said first variable attenuator and said first variable phase shifter so that the level of said first pilot signal extracted by said first pilot signal extracting means goes down below a predetermined first reference value.

3. The feedforward amplifier of claim 2, further comprising: a second pilot signal injecting means inserted between stages of said main amplifier, for injecting thereinto a second pilot signal; and second pilot signal extracting means inserted in the output path of said distortion elimination circuit, for extracting said second pilot signal;

wherein said control means controls said second variable attenuator means and said second variable phase shifter means so that the level of said second pilot signal extracted by said second pilot signal extracting means goes down below a predetermined second reference value.

4. The feedforward amplifier of claim 3, further comprising: a third pilot signal injecting means inserted between stages of said first auxiliary amplifier, for injecting thereinto a third pilot signal; and third pilot signal extracting means inserted in the output path of said first auxiliary amplifier distortion elimination circuit, for extracting said third pilot signal;

wherein said control means controls said third variable attenuator means and said third variable phase shifter means so that the level of said third pilot signal extracted by said third pilot signal extracting means goes down below a predetermined third reference value.

5. The feedforward amplifier of claim 2, further comprising second pilot signal extracting means inserted in the input path of said second auxiliary amplifier, for extracting said second pilot signal pilot signal;

wherein said control means controls said fourth variable attenuator means and said fourth variable phase shifter means so that the level of said second pilot signal extracted by said second pilot signal extracting means goes down below a predetermined second reference value.

6. The feedforward amplifier of claim 2, further comprising: a fourth pilot signal injecting means inserted in the input path of said first auxiliary amplifier, for injecting thereinto a fourth pilot signal; and fourth pilot signal extracting means inserted in the input path of said second auxiliary amplifier, for extracting said fourth pilot signal;

wherein said control means controls said fourth variable attenuator means and said fourth variable phase shifter means so that the level of said fourth pilot signal extracted by said fourth pilot signal extracting means goes down below a predetermined fourth reference value.

7. The feedforward amplifier of claim 1 or 2, further comprising: third signal extracting means inserted in the output path of said distortion elimination circuit, for extracting therefrom a signal; and demodulating means for generating a correcting signal through demodulation of said signal extracted by said third signal extracting means;

wherein said control means controls said second variable attenuator means and said second variable phase shifter means based on said correcting signal.

8. The feedforward amplifier of claim 7, further comprising: third signal extracting means inserted in the output path of said first auxiliary distortion elimination circuit, for extracting therefrom a signal; and demodulating means for generating a correcting signal through demodulation of said signal extracted by said third signal extracting means;

wherein said control means controls said third variable attenuator means and said third variable phase shifter means based on said correcting signal.

9. The feedforward amplifier of any one of claims 1 to 8, wherein said control means includes: a first controller for controlling said first variable attenuator means and said first variable phase shifter; a second controller for controlling said second variable attenuator means and said second variable phase shifter means; a third controller for controlling said third variable attenuator means and said third variable phase shifter; and a fourth controller for controlling said fourth variable attenuator means and said fourth variable phase shifter means.

* * * * *